United States Patent [19]

Nienhuis et al.

[11] 3,772,576

[45] Nov. 13, 1973

[54] PLANAR SEMICONDUCTOR DEVICE WITH SCRIBE LINES AND CHANNEL STOPPER

[75] Inventors: Rijkent J. Nienhuis; Cornelis A. Busselaar, both of Nijmegen, Netherlands

[73] Assignee: U.S. Philips Corp., Briarcliff Manor, N.Y.

[22] Filed: Dec. 30, 1971

[21] Appl. No.: 213,947

Related U.S. Application Data

[62] Division of Ser. No. 131,252, April 5, 1971, which is a division of Ser. No. 772,718, Nov. 1, 1968, abandoned.

[30] Foreign Application Priority Data

Nov. 4, 1967 Netherlands ........................ 6715014

Nov. 4, 1967 Netherlands ........................ 6715013

[52] U.S. Cl. 317/235 E, 317/234 N, 317/235 WW, 317/235 AG, 317/235 AH, 317/235 R

[51] Int. Cl. ............................ H01l 5/00, H01l 7/02

[58] Field of Search .................. 317/235 E, 235 AB, 317/235 WW, 235 AG

[56] References Cited

UNITED STATES PATENTS

| | | | |
|---|---|---|---|
| 3,197,681 | 7/1965 | Broussard | 317/235 |
| 3,283,170 | 11/1966 | Buie | 307/88.5 |
| 3,395,320 | 7/1968 | Ansley | 317/234 |

FOREIGN PATENTS OR APPLICATIONS

| | | | |
|---|---|---|---|
| 993,388 | 5/1965 | Great Britain | 317/235 |

*Primary Examiner*—John W. Huckert
*Assistant Examiner*—Joseph E. Clawson, Jr.
*Attorney*—Frank R. Trifari

[57] ABSTRACT

A discrete semiconductor device and method of making same by severing a chip from a wafer containing a plurality of such devices made by planar techniques is described. The invention features the diffusion of a continuous grid pattern, preferably simultaneously with the base diffusion, defining future scribe lanes along which the wafer will be scribed prior to severance into chips. Subsequently, a second diffusion step, preferably simultaneously with the emitter diffusion, is carried out to provide, completely overlapping the previously diffused region, an annular region having a higher dopant level to inhibit creation of a channel between the base region and the chip edge. Subsequently, the wafer is severed into chips along the scribe lanes.

5 Claims, 8 Drawing Figures

Figure 1:
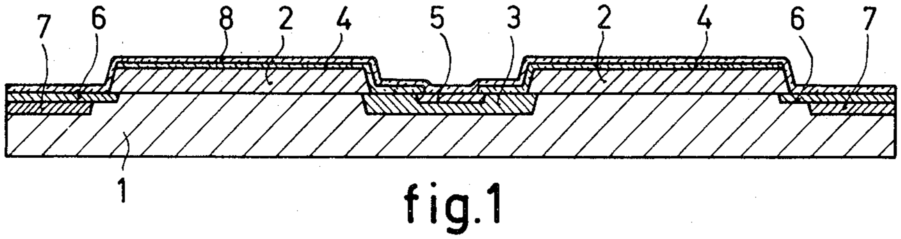

*INVENTORS.*
RIJKENT J. NIENHUIS
CORNELIS A. BOSSELAAR
*BY*
AGENT

PLANAR SEMICONDUCTOR DEVICE WITH SCRIBE LINES AND CHANNEL STOPPER

This application is a division of prior U.S. application Ser. No. 131,252, filed Apr. 5, 1971, which is a division of U.S. application, Ser. No. 772,718, filed Nov. 1, 1968, now abandoned.

The invention relates to a planar semiconductor device such as a planar transistor, a diode or an integrated circuit, in which on one side of a semiconductor body one or more zones of different conductivity types and/or conductivities are formed in a semiconductor region of a first conductivity type extending as far as the edge of the semiconductor body, and further an edge zone of a second conductivity type opposite to the first conductivity type is diffused into the semiconductor region, and to a method of manufacturing such a semiconductor device.

In British Pat. specification No. 993,388, a semiconductor device has been described in which an edge zone, which is to be understood herein to mean a narrow zone adjoining the edge of the semiconductor body, is obtained by diffusion into paths of a wafer of semiconductor material which is then divided along said paths into parts each comprising a semiconductor device. In semiconductor technology, such paths are referred to as "scribing lanes." In semiconductor devices of the kind set forth, the conductivity type of a surface layer below an insulating layer (commonly used in planar devices) in the semiconductor region consisting, for example, of the original material of the semiconductor body or of an epitaxial layer may be inverted. Such an inverted surface layer is referred to hereinafter as "channel" and extends in the known embodiment from the edge zone to another zone of the second conductivity type which at least at the surface adjoins the semiconductor region of the first conductivity type. A disadvantage of this inversion of the conductivity type of the surface layer is that a conductive connection is established between the edge zone and the other zone of the second conductivity type, which may result in the occurrence of spontaneous phenomena such as breakdown at the edge of the semiconductor body, which phenomena adversely affect the electrical properties of the semiconductor device. These phenomena at the edge may involve, for example, an unfavourably low breakdown voltage and a high leakage current of the semiconductor device and can be reproduced only with difficulty, that is to say that in mass production semiconductor devices of the same type manufactured under substantially equal conditions have different breakdown voltages and leakage currents.

The invention has for an object to avoid the said disadvantage. The semiconductor device mentioned in the preamble is therefore characterized in that a narrow annular zone of the first conductivity type is formed at the surface of the said side of the semiconductor body in the semiconductor region and adjoins a continuous edge zone, while it extends at least substantially parallel to the edge and bounds at the said surface of the semiconductor body the whole periphery of the semiconductor region and is more strongly doped at least at the surface than the adjoining parts of the semiconductor region.

A narrow annular zone is to be understood herein to mean a zone in which the distance of the inner periphery adjoining the periphery of the semiconductor region from the inner periphery of the edge zone is of the order of, for example, 1 to 10 $\mu$m. Of course, this implies that the distance between the perpendicular projections of the inner peripheries of the annular zone and of the edge zone on the surface must be equal to the said distance. The narrow annular zone acts as a channel stopper because its stronger doping prevents the inversion of a surface layer below the insulating layer at the said annular zone. Due to the presence of this channel stopper, it is achieved that any breakdown does not occur at the edge of the semiconductor body so that in the case of breakdown the reverse voltage at the input of the channel, i.e., at the other zone of the second conductivity type between the channel and the subjacent semi-conductor region is higher than in the absence of a channel stopper.

It should be noted that it is known to use a channel stopper to prevent breakdown. The known channel stopper is arranged in a semiconductor region at a small and substantially uniform distance from another zone of the second conductivity type forming an active part of the semiconductor device. With such a channel stopper, a situation is likely to arise in which the breakdown at the part of the surface below the insulating layer adjoining the channel stopper occurs at a lower reverse voltage between the channel and the subjacent semiconductor region at the other zone than at other areas of the semiconductor device.

This can be accounted for by the fact that due to the small length of the channel, the voltage drop across the channel, through which often flows a small leakage current, is low. However, in the semiconductor device according to the invention, the reverse voltage between the channel and the subjacent semiconductor region at the other zone is high in the case of breakdown at the surface part adjoining the channel stopper because the length of the channel is large and the voltage drop across the channel is high.

As to interruption of a conductive connection between the edge zone and another zone of the second conductivity type, particularly favourable results are obtained if the distance of the inner periphery of the narrow annular zone from the inner periphery of the edge zone is from 3 to 10 $\mu$m and preferably from 7 to 9 $\mu$m.

A method of manufacturing semiconductor devices according to the invention, in which a large number of semiconductor devices are provided by means of planar techniques on a wafer of semiconductor material which is then divided along lanes into parts each comprising a semiconductor device, which planar techniques comprise at least a photo-etching process and a diffusion process, and in the etching step the lanes and at the same time other parts of the semiconductor surface are exposed and an impurity of the second conductivity type is diffused into the lanes and into the relevant parts so that the edge zones are formed in the semiconductor regions, is characterized in that by means of a second photo-etching and diffusion process an impurity of the first conductivity type is diffused so that zones of the first conductivity type are diffused at least in part into the lanes and into the adjoining strips of the semiconductor region while during the further treatments at least parts of these diffusion zones remain intact and form the narrow annular zones.

A positive or a negative photolacquer is used for the photo-etching process. As is known, a positive photolacquer is a lacquer of the type which, when exposed to light, becomes soluble in the associated developer, whereas a negative photolacquer is a lacquer of the type which, when exposed to light, becomes insoluble in the associated developer.

In a preferred embodiment of the method according to the invention, a positive lacquer is used at least for the second etching process and the annular zones of the first conductivity type are diffused over a larger width than the edge zones previously applied.

In the second photo-etching process, the wafer of semiconductor material coated with a positive lacquer is covered by a photomask which leaves uncovered the lanes in the semiconductor wafer and also at least the part of the insulating layer on the surface which covers the edge zone. During the diffusion process, the annular zones are then diffused over a larger width than the edge zones previously applied. If a negative lacquer is used for the second photo-etching process, the photomask will not leave the lanes completely uncovered and the annular zone cannot overlap the edge zone. In this case, the method is preferably carried out so that in the second photo-etching process a photomask is used which has lines which are located outside the lanes and whose width plus distance from the lanes is from 7.to 9 $\mu$m. During developing, the photolacquer is then dissolved at the non-exposed lines. During etching, the insulating layer is removed from the surface at these areas and during the next diffusion step the annular zones are diffused so that each of these zones bounds at the surface the whole periphery of the relevant semiconductor region.

Figure 5:
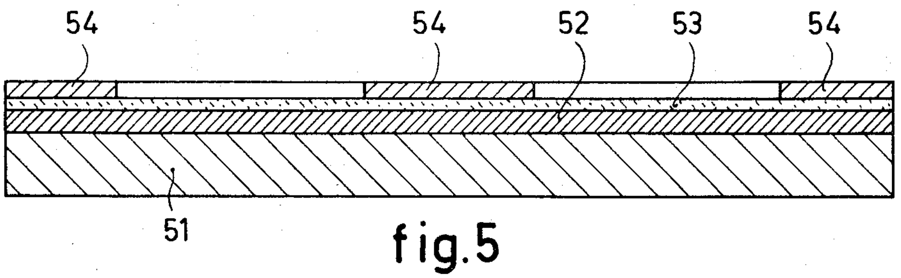
Figure 1A:
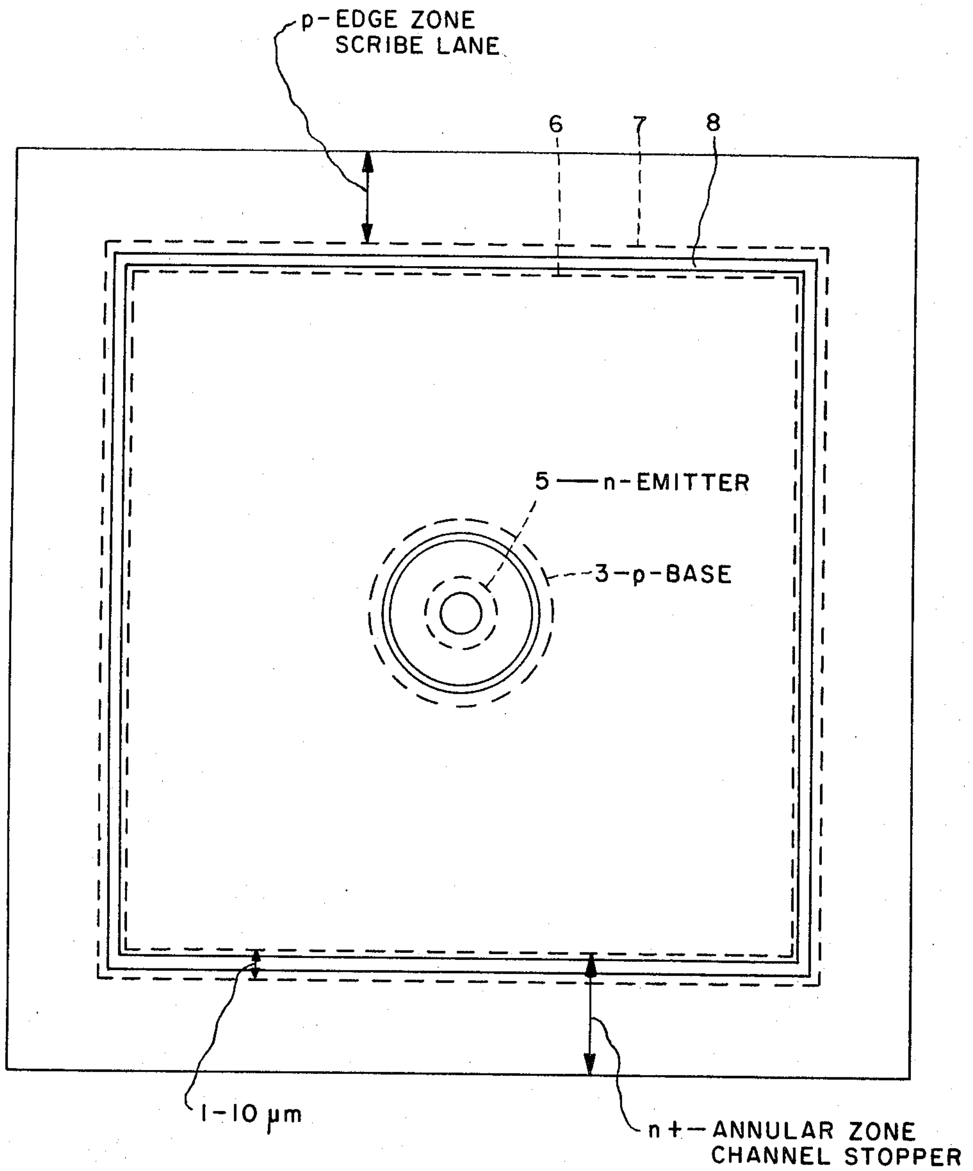
Figure 6:
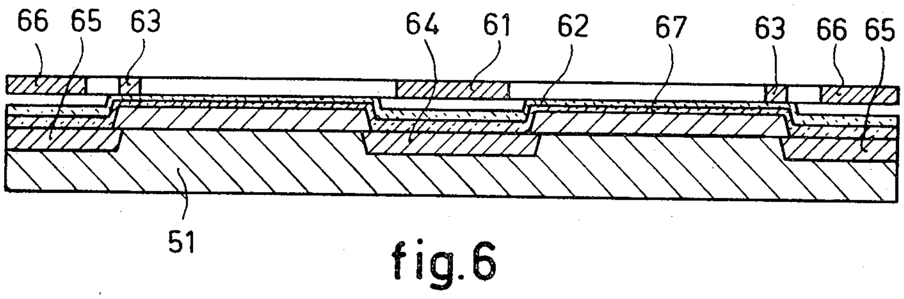
Figure 7:
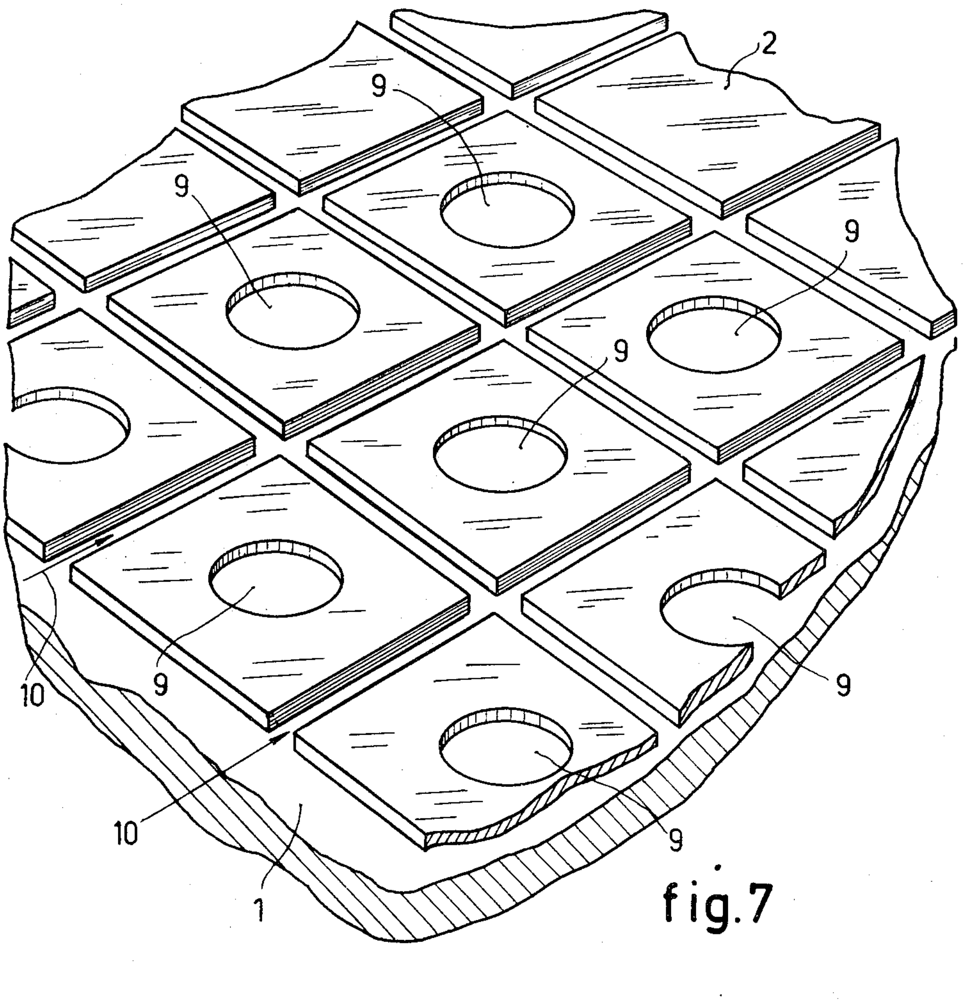

The invention will now be described more fully with reference to the accompanying drawing, in which:

FIG. 1 is a diagrammatic sectional view of a first semiconductor device according to the invention, FIG. 1*a* is a plan view of the top of the device of FIG. 1, FIGS. 2, 3 and 4 are diagrammatic sectional views of the first semiconductor device according to the invention at a number of manufacturing stages, FIGS. 5 and 6 are diagrammatic sectional views of a second semiconductor device according to the invention at a number of manufacturing stages, and FIG. 7 is a perspective view of part of a wafer of semiconductor material.

Although during manufacture the semiconductor devices form part of (various) wafers of semiconductor material, they are shown separately for clarity. In the various Figures, corresponding parts are denoted by the same reference numerals.

FIG. 1 is a cross-section of a planar transistor according to the invention. Component parts which are not essential to the invention, such as the contacts and the envelope, are not shown for the sake of clarity. A semiconductor region 1 consisting, for example, of *n*-type silicon is provided with an oxide layer 2, into an opening of which is diffused the base 3. The edge zone 7 corresponding to the diffusion region of the base 3 is located at the edge of the semiconductor region, The emitter 5 is also diffused into said opening and is bounded by an opening in a glass layer 4. A diffusion region, the annular zone 6, corresponding to the emitter 5 extends along the edge of the semiconductor surface. The openings for the diffusion regions 5 and 6 and the remaining part of the semiconductor surface are covered by a glass layer 8. Openings in covering layers for contacting the device and openings along the edges of the device to expose the silicon surface for facilitating the division of the wafer are not shown. Division is accomplished, as is well known, by scribing score lines along the scribe lanes and then breaking the wafer into discrete chips. These openings are arranged so that transitions between differently doped regions remain fully covered, as is usual in planar semiconductor devices. The annular zone 6 extends over a wider surface than the edge 7 so that it can act as a channel stopper. In the following description of the method, the known steps not essential to the invention have been left out.

Figure 2:
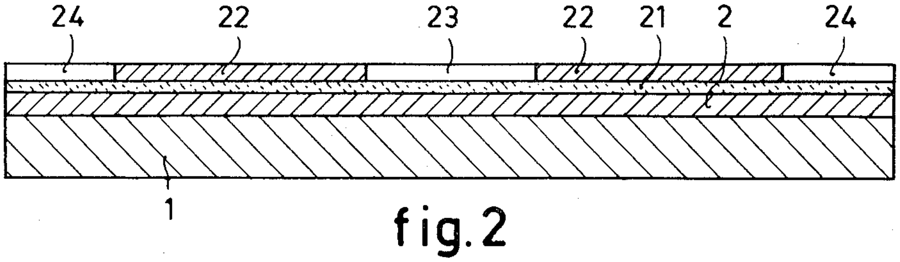

FIG. 2 shows the semiconductor region 1 on which a layer of silicon oxide 2 is provided by oxidation at an elevated temperature. The silicon oxide is coated with a layer 21 of a positive photolacquer on which is disposed a photomask 22 provided with openings 23 and 24 for the base and for the lanes, respectively.

The mask is removed after exposure, the lacquer layer is developed and a pattern corresponding to that of the photo-mask 22 is etched, for example, by means of a $NH_4F$-HF solution in the oxide layer 2 in which openings 9 and 10 for the base and for the lanes, respectively, are formed. The remaining part of the lacquer layer is removed by means of a suitable solvent (cf. FIG. 7) and boron is then diffused into the said openings from the gaseous phase by reaction at the free silicon surface, for example, with borobromide vapour (cf. FIG. 3) so that *p*-type base diffusion regions 3 and corresponding boron-doped *p*-type edge zones 7 are formed. A borate glass layer 4 is then also formed.

Figure 3:
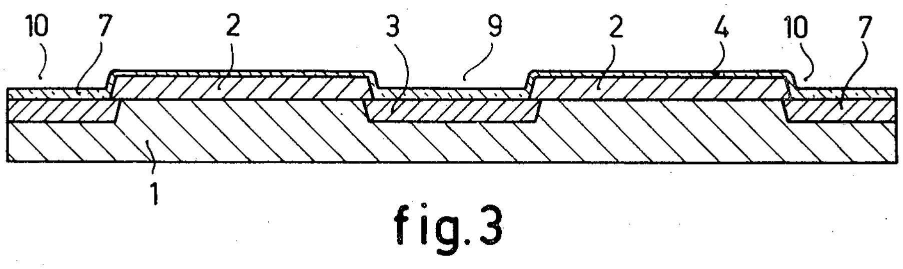
Figure 4:
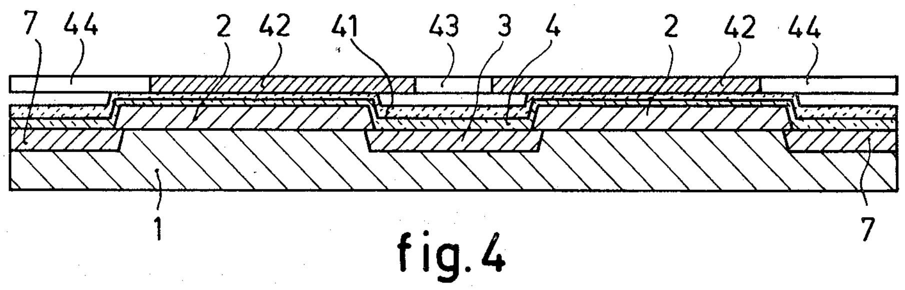

It appears from FIG. 3 that the diffusion regions 3 and 7 also extend below the oxide layer 2 over a distance of approximately 3 $\mu$. After a prolonged reoxidation, a layer 41 of a positive lacquer is applied to the wafer and a mask 42 is then disposed thereon (cf. FIG. 4). The mask 42 is provided with openings 43 and 44 for the emitter and for the annular zones, respectively. The openings 44 are approximately 16 $\mu$ wider than the openings 24 for the edge zones in the first photomask. The mask is trued on the wafer so that the distance of the edges of the lanes in the mask from the edges of the lanes in the wafer is approximately 8 $\mu$. Thus, it is achieved in practice that after etching and during the next diffusion steps the zones to be diffused fully cover the edge zones 7 previously applied. Again, after exposure to light, the mask is removed, the lacquer layer is developed and the pattern is etched on the glass- and oxide layers. The remaining part of the lacquer layer is removed by means of a suitable solvent and phosphorous is then diffused into the said openings from the gaseous phase by reaction at the free silicon surface, for example, with phosphorous oxychloride so that *n*-type emitter diffusion regions 5 and corresponding annular zones 6 in the lanes are formed (cf. FIG. 1).

The method is carried out slightly differently if a negative photolacquer is used instead of a positive photolacquer.

FIG. 5 shows in a manner analogous to FIG. 2 a substrate 51 to which are applied an oxide layer 52 and then a layer 53 of a negative photolacquer on which is disposed a photomask 54.

In this case, however, the photomask is opaque at the area of the openings in FIG. 2. It will be evident that after exposure to light, removal of the mask, etching, solution of the non-exposed lacquer layer and diffusion of boron, during which process (cf. FIG. 6) the emitter region 64 and the edge zones 65 and the borate glass layer 67 are formed, the same result is obtained as is indicated in FIG. 3.

In the second photo-etching process, the mask will not leave the lanes completely uncovered and the annular zone to be diffused cannot overlap the edge zone. In order still to attain this desired situation as far as possible, (cf. FIG. 6) the photomask disposed on the layer 62 of negative lacquer has besides the opaque parts 61 above the emitters to be formed and 66 above the lanes opaque lines 63 which extend along the edges of the lanes and whose width plus distance from the lanes is approximately 8 $\mu$.

Again, after exposure to light, the mask is removed, the lacquer layer is developed and an etching process is carried out. It is possible that the lines 63 lie on an oxide layer of a thickness such that the etching process should be carried out in several steps, in at least one of which solely the pattern of the lines 63 is etched. Thus, damage to the semiconductor surface at the area at which the oxide layer has a smaller thickness is prevented. In this etching step, the part of the oxide layer between the pattern of lines and the edges of the lanes will often also be removed due to under-etching. The method is further carried out in the same manner as with the use of a positive photolacquer.

The invention is of course not limited to the manufacture of transistors. For example, diodes and integrated circuits may also be manufactured by the method described.

Mutatis mutandis, the method according to the invention may also be used in the presence of surface layers consisting of a material other than silicon oxide, for example, silicon nitride. As a matter of fact, inter alia the photo-etching process will be modified accordingly.

What is claimed:

1. A planar semiconductor device comprising a semiconductor body having severed peripheral edges and having a first semiconductor region of one conductivity type extending to the severed edges of the semiconductor body and within the first region a second surface zone of the opposite conductivity type spaced from the body edges and forming a *p–n* junction with the first region, said body also having a third continuous narrow surface edge zone of said opposite conductivity type extending to and all around the peripheral severed edges of said body, and a continuous narrow annular fourth zone of the one conductivity type formed at the surface on the same side of the semiconductor body as the other zones, said fourth zone adjoining the third edge zone and extending to the severed edges and all around the whole periphery of the first semiconductor region, said annular fourth zone being more strongly doped at least at the surface than the adjoining parts of the first region, said fourth zone being wider than the third zone and thus overlapping completely the third zone with the inner peripheral edge of the fourth zone being closer to the second surface zone than that of the third zone, whereby the breakdown voltage and leakage current characteristics of the device are improved.

2. A planar semiconductor device as set forth in claim 1 wherein the surface containing the zones is covered with an insulating layer, the insulating layer on the first region between the second and fourth zones being thicker than that on the fourth zone.

3. A planar semiconductor device as set forth in claim 1 wherein the fourth zone overlaps the third zone by between 3 to 10 $\mu$m.

4. A planar semiconductor device as set forth in claim 1 wherein the device is a transistor, the second zone is the base zone, a fifth emitter zone of one conductivity type nests within the second base zone, the impurity distribution of the opposite-type conductivity forming impurities is a maximum at the surface and is the same in both the second base zone and the third edge zone, and the impurity distribution of the one-type conductivity forming impurities is a maximum at the surface and is the same in both the fifth emitter zone and the fourth annular zone.

5. A device as set forth in claim 4 wherein the second and third zones have the same depth, and the fourth and fifth zones have the same depth.

* * * * *